United States Patent [19]

Bove et al.

[11] 4,038,599

[45] July 26, 1977

[54] HIGH DENSITY WAFER CONTACTING AND TEST SYSTEM

[75] Inventors: Ronald Bove; Eric M. Hubacher, both of Wappingers Falls, N.Y.

[73] Assignee: International Business Machines Corporation, Armonk, N.Y.

[21] Appl. No.: 537,514

[22] Filed: Dec. 30, 1974

[51] Int. Cl.$^2$ .................. G01R 31/02; G01R 31/26
[52] U.S. Cl. ............................. 324/158 F; 324/73 R; 324/158 P
[58] Field of Search ............ 324/158 F, 158 P, 158 R, 324/73 R, 72.5

[56] References Cited
U.S. PATENT DOCUMENTS

| | | | |
|---|---|---|---|
| 3,246,240 | 4/1966 | Arnold et al. | 324/73 R |
| 3,806,801 | 4/1974 | Bove | 324/158 F |
| 3,815,025 | 6/1974 | Jordan | 324/73 R |
| 3,849,726 | 11/1974 | Justice | 324/73 R |
| 3,963,986 | 6/1976 | Morton et al. | 324/158 F |

*Primary Examiner*—Palmer C. Demeo
*Assistant Examiner*—Ernest F. Karlsen

*Attorney, Agent, or Firm*—Wesley DeBruin

[57] ABSTRACT

A contactor structure employed in a high speed electronic test system for testing the electrical integrity of the conductive paths (or lines) in the packaging substrate prior to the mounting and connection thereto of the high circuit density monolithic devices. The contactor structure includes a semiconductor space transformer fabricated by large scale integration techniques and containing a plurality of discrete first integrated circuits. The first integrated circuits of the space transformer being respectively electrically connected to said electrical probes. Second integrated circuitry interconnecting said first integrated circuits is also contained within said semiconductor space transformer. Under control of said test system said second integrated circuitry selectively energizes, selected first and second ones of said first integrated circuits. Each of said first integrated circuits contains circuitry, whereby said selected first and second ones of said first circuits will manifest the electrical integrity of the electrical path there between.

5 Claims, 5 Drawing Figures

HIGH DENSITY WAFER CONTACTING AND TEST SYSTEM

BACKGROUND OF THE INVENTION

In obtaining the electrical characteristics of components and packaging structures, such as integrated circuits and multilayer ceramic substrates, it is imperative that the connecting paths from the tester to the device or structure under test, have a controlled electrical environment so as not to distort the test signals and test results. This is especially important in light of the ever increasing circuit speeds and density of the components under test.

Also increasing, in addition to the circuit speeds of the integrated circuits are the number and density of the interconnection pads on the integrated circuit device and the packaging substrate. Namely, the density of the circuitry on a monolithic device is increasing as the art advances. This increase in circuit density in an integrated circuit, in many, if not all instances, dictates a greater number and density of the connection pads on an integrated circuit. Correspondingly, the number and density of connection pads on the packaging substrate must be increased to accommodate the increase in number and density of connection pads of the high circuit density integrated circuit. Further, as the circuit density and speed of the integrated circuit increases the conductive paths within the packaging substrate increase in number and density and their length must be reduced or at least not increased. These factors oppose from a practical, or fabrication point of view, the ability of a contacting system to achieve a minimum acceptable distortion environment. These factors, as the art progresses, render the testing of integrated circuit devices, and interconnecting packaging structures more difficult. As the art progresses, the testing problems requiring solution are many and complex. Included in these test problems are the electrical environment, namely the electrical contacting of a densely spaced array of pads with each electrical connection having substantially equal and minimum uniform impedance characteristics. In testing the electrical connections to the pads must be made rapidly, and precisely, and must not place undue stress on, or mechanically damage the pads.

A major portion of the electrical path from the tester to the device under test and return is used for the space transformation function. It purpose is to take a large multiplicity of electrical conductors from the tester, which are relatively spaciously arrayed, and transform them into a highly dense array, similar to, or identical to, the device input output pad density pattern. Since the conducting path length from the tester to the device under test is dominated by the space transformer, for electrical testing to be done successfully, a constant impedance environment is necessitated.

Reference is made to United States Patent Application, now U.S. Pat. No. 3,911,361, Ser. No. 484,052, by Ronald Bove' et al., filed on June 28, 1974, entitled "Coaxial Array Space Transformer" and of common assignee herewith.

U.S. Pat. No. 3,911,361, is directed to circuit means for connecting a high speed electronic tester to a high circuit density monolithic device under test and where said circuit means includes a unitary structural combination of a space transformer and a probe structure, said space transformer and said probe structure being mechanically and electrically mated to provide a plurality of discrete physical electrical contacts with said device under test, said space transformer including: a printed circuit board having a plurality of discrete electrically conductive contact areas and at least one relatively large contact area; a densely spaced array of discrete electrical contacts; said densely spaced array of discrete electrical contacts being supported by and maintained in spaced relationship one to another by a material having predetermined dielectric characteristics; a plurality of coaxial cables; each, of said coaxial cables having an inner conductor, an outer ground shield and dielectric material maintaining said inner conductor and said outer ground shield in spaced relationship; each of said inner conductors of said plurality of coaxial cables being connected between a predetermined one of said plurality of discrete electrically conductive contact areas on said printed circuit board and a predetermined one of said densely spaced array of electrical contacts; a plurality of metallic plates for supporting said plurality of coaxial cables in spaced relationship; connection means for electrically connecting in common each of said plurality of metallic plates, each of said outer ground shields of said plurality of coaxial cables, and said relatively large contact area on said printed circuit board; said probe structure having a plurality of electrically discrete buckling beam probes; each of said buckling beam probes makingg physical and electrical contact with a predetermined one of said densely spaced array of discrete electrical contacts; each of said buckling beam probes having a length many times its cross-sectional area whereby the probes buckle when an axial load is applied thereto.

Reference is made to U.S. Pat. No. 3,731,191 granted May 1, 1973 for a "Micro-Miniature Probe Assembly" to Robert L. Bullard et al. and of common assignee herewith.

U.S. Pat. No. 3,731,191 is directed to a multi-probe test circuit assembly particularly adapted for producing low resistance electrical connections to a semiconductor component of which the electrical parameters are to be evaluated.

In accordance with the invention disclosed and claimed in U.S. Pat. No. 3,731,191, a contact apparatus in provided in which a plurality of probe elements are fixedly held by a common support housing in a fixed array corresponding with the terminal contact pattern of the circuit device to be engaged for testing. Essentially, the probe elements comprise individual tubular probe guides with individual probe wires, or the like, removably contained and compressible within the probe guides. Fixation of the probe elements in the desired array is provided by an encapsulation housing including a support plate portion of the support housing having a plurality of openings arranged to correspond with the test contact pattern of the circuit device. One end of each of the tubular probe guides is attached to the support plate within the plate openings while the other end is held within the housing preferable adjacent and in abutment with a pressure plate opposite the remote ends of the probe guides. The probe wires are designed such that when fully inserted within the probe guide, they extend a controlled amount beyond the end of the housing support plate while the remote ends of the probe wires abut the pressure plate. The tubular probe guides are high conductivity material while the probe wires are conductive material having high resistance to abrasive wearing. Electrical circuit continuity is made by surface contact of the probe wires within the probe guides which are in turn connected to external connecter boards or the like mounted on the housing and having provision for connection to external test circuits or the like.

In U.S. Pat. No. 3,731,191, the probe guides are preferably curved between their ends within the housing. Thus, when contact is made with a test terminal, the probe wires have a spring-like quality and are compressible within the probe guides, the curvature and spring-like qualities of the probe wires causing electrical contact to occur very close to the contact end of the probe guide. Thus, only a short length of the relatively high resistance probe wire is in the electrical circuit while the high conductivity probe guide acts as the principal electrical connection with the external circuits. Since the probe guides and probe wires are conductive, the contact apparatus is essentially made of dielectric materials, particularly the support plate and the pressure plates. In addition, the probe guides are completely encapsulated within a dielectric material so that the probe elements are mutually electrically insulated as well as being held rigidly in position.

Reference is made to U.S. Pat. No. 3,806,801 granted Apr. 23, 1974 to Ronald Bove, directed to a "Probe Contactor Having Buckling Beam Probes", and of common assignee herewith.

U.S. Pat. No. 3,806,801, discloses a probe contactor in which each of the probes will exert a substantially constant force on each of the pads on the chip irrespective of the relative heights of the pads on the chip as long as the pads on the chip have their height within the predetermined range in which the probes can engage the pads. This is accomplished by forming each of the probes with a length many times its cross sectional area so that each of the probes may be deemed to be a beam. Each of the probes is designed so that it will deflect over a range when a predetermined force is applied at its end engaging the pad to axially load the probe so as to prevent any additional force, beyond the predetermined force, being applied to the pad due to engagement of the pad with the probe.

Reference is made to U.S. Pat. No. 3,806,800, granted Apr. 23, 1974, to Ronald Bove and Eric M. Hubacher, directed to "Method and Apparatus for Determining the Location of Electrically Conductive Members on a Structure", and of common assignee herewith. In U.S. Pat. No. 3,806,800, the electrically conductive pads on a semiconductor chip or the engineering change pads on a multilayer substrate are located electronically relative to probes which are in a predetermined orthogonal orientation, so that the particular probe or probes in engagement with each of the pads is determined. Then, the electrical characteristics of any electrical unit connected to each of the pads is ascertained through selectively controlling the electrical power supplied through the probes to the pads in a controlled manner.

U.S. Pat. No. 3,835,381, granted Sept. 10, 1974 to O. R. Garretson et al., entitled "Probe Card Including A Multiplicity of Probe Contacts and Methods of Making" discloses a probe card useful in testing the effectiveness and utility of semiconductor devices and hybrid circuit substrates prior to the application to such devices and substrates of terminal leads for interconnection with other components. The probe card includes a unitary electrically conductive probe assembly including a multiplicity of closely spaced conductive probes arranged in a radiating array to provide a multiplicity of contact tips adapted to be pressed with uniform pressure and contact resistance on the terminal pads of semiconductor devices and hybrid circuit substrates.

SUMMARY OF THE INVENTION

The integrity of closely spaced electrical conductive paths or lines on a semiconductor wafer or multilayered ceramic substrate are verified by use of a plurality of probes arranged in a predetermined orientation in conjunction with a semiconductor space transformer containing switching logic fabricated therein by Large Scale Integration Techniques. The orientation of the probes is identical to the orientation of the conductive pads on the substrate to be tested. The switching logic within the semiconductor space transformer is selectively connected to the probes by an electrical interface between the probe structure and the semiconductor space transformer. The space transformer includes circuitry actuating selected portions of said switching logic and the probes discretely connected to said portions. The switching logic further includes circuitry for manifesting the electrical integrity of the conductive path, if any, extending between the conductive substrate pads contacted by said actuated probes. Thus, a large multiplicity of densely spaced interconnections contained within a packaging substrate may be tested in a rapid, efficient, practical, reliable and economical manner. Further, the practice of the invention, as will be more fully apparent by the more detail description set-forth hereinafter, accomplishes the "tailoring" of the electrical environment to the device under test.

Further, as will also be more apparent to persons skilled in the art from the description that follows the practice of the invention is not limited to electrical D.C. testing of passive structures. The invention is clearly applicable to A.C. and D.C. testing of passive and active devices such as integrated circuit structures having a high circuit density.

Semiconductor or multilayered products with electrically conductive paths (lines) incorporated therein are utilized as substrates on which semiconductor chips are mounted. These substrates may be generically termed packaging structues, or substrates, as known in the art, they may have a wide variation in material, form, and structure. The interconnecting paths are embedded in these packaging substrates and interconnect the various devices which are attached in later process steps. With increased miniaturization of semiconductor products, the multiplicity, and the density of these paths, has increased and continues to increase. In this environment it is imperative to rigorously test, or verify, the electrical integrity of the interconnecting paths in the packaging substrate. The term electrical integrity may be defined as including the "open" or "short" condition of the electrical path and the electrical characteristics of the path such as resistance capacitance, inductance, impedance, cross talk, etc. The use of two single probes, as heretofore, widely practiced in the art has become impractical since it necessitates that the probes repeatedly contact each pair of test points (pads) on the semiconductor or multilayer substrate (packaging structure). The use of two single probes has numerous recognized disadvantages. It is time consuming. It requires repeated precise alignments of the probes with the very small pads. The two probe technique results in damage to the pads of the packaging structure due to the repeated contacting of the pads, and high production costs are incurred due to the numerous lengthy steps of the align and test procedure required.

The use of two contactors, each comprising a multiplicity of probes reduces the stepping and repeated contact of the pads on the packaging substrate. However, this approach requires several complex alignments and places a severe physical constraint on the probe-space transformer assembly which must be designed to contact adjacent test point (pad) clusters on the packaging substrate.

The present invention obviates the foregoing problems by utilizing a contactor consisting essentially of a plurality of probes and a solid state integrated circuit space transformer. The plurality of probes are arranged in a predetermined orientation which is identical to the orientation of the test pads on the packaging substrate to be tested. The assembly of probes readily permits physical contacting of each of a relatively large number of closely spaced test points (pads) on a packaging substrate. The assembly of probes preferably may be similar to, or patterned after the probe assembly disclosed and claimed and in the afore-identified and discussed Bove U.S. Pat. No. 3,806,801.

The contactor of the invention consisting essentially of the electrically and mechanically mated assembly of test probes and the solid state space transformer provides conductive paths from the tester to the product, device, or structure under test. The solid state space transformer is preferably a silicon wafer containing integrated circuitry and metallized conductive paths (lands). The semiconductor space transformer may be fabricated by Large Scale Integration techniques known to the art. Entering the periphery of the solid state space transformer are control signal and power supply conductors which are used to functionally activate the circuitry including logic circuitry contained within the space transformer. By externally addressing the control signal conductors, for example, via an input from a tester under control of a computer, the solid state space transformer circuitry activates two selected probes within the assembly or probes contacting the test points, or pads, on the product, or packaging substrate under test. Once activated, the selected probes and associated circuitry within the space transformer determines the electrical integrity, for example, open or short, existing between the two test points or pads on the device, product, or packaging substrate under test. The circuitry within the solid state transformer provides an electrical manifestation indicative of the merit, or lack of merit, of the electrical path, or circuitry contained within the device under test electrically connected to the pads contacted by the actuated probes. This electrical manifestation is communicated from the solid state space transformer through one or more of the periphery conductors thereon to a computer. The computer compares this electrical manifestation with a known correct result stored therein. It is to be appreciated that the full data processing capability of the computer system may be envoked to further process the test results. Such further processing of test data is well known in the art and no further discussion thereof is deemed necessary of required to a full understanding and appreciation of applicants' invention.

It is a primary object of the invention to provide an improved High Density Wafer Contacting and Test System.

It is a primary object of the invention to provide an improved contactor structure and circuitry for use in a high speed electronic test system wherein the merit, or lack of merit, of electronic devices, and structures employed therewith, is determined.

It is a primary object of the invention to provide, in a high speed electronic test system, an improved contactor structure for contacting test points on a device under test.

It is a primary object of the invention to provide an improved device under test contactor structure for use in a high speed electronic test system, where said contactor structure comprises a precision probe assembly electrically interfaced with a solid state integrated circuit space transformer. The space transformer circuitry is adapted to provide via the probe assembly predetermined electrical conditions on the device under test or selected portions thereof. The space transformer circuitry is further adapted to provide an electrical manifestation, or manifestations, as to the merit or integrity of the device under test, or portion thereof under test.

It is a primary object of the invention to provide a solid state space transformer having integrated circuitry contained therein and particularly adapted to function in electronic test systems for testing electrical devices.

It is an object of the invention to provide means to efficiently, reliably and economically test for shorts and opens in an electronic structure, such as chip site areas on undiced semiconductor wafers.

It is an object of the invention to provide a semiconductor space transforming wafer which reduces wiring complexity and hardware when employed in an electronic test system.

It is an object of the invention to provide in a test system a device under test contacting structure for reducing test time.

It is an object of the invention to provide in a test system a device under test contacting structure which prevents damage to the device under test by obviating the need for multiple probing of the device under test.

It is a still further object of the invention to provide in a test system a device under test contacting structure containing a plurality of selectable integrated circuits, whereby the software requirements of the test system are reduced.

It is an object of this invention to provide in a test system a device under test contacting structure which eliminates stepping across a semiconductor wafer under test.

It is an object of this invention to provide in a test system a device under test contacting structure where all products having the same grid pattern of test points may be tested by said test system.

It is an object of this invention to provide in a test system a device under test contacting structure comprising a solid state integrated circuit space transformer electrically and mechanically mated to a precision probe assembly, whereby said probe assembly, which is wear sensitive and subject to damage, may be readily replaced.

The foregoing and other objects, features and advantages of the invention will be more apparent from the following more particular description of the preferred embodiment of the invention, as illustrated in the accompanying drawings.

DESCRIPTION OF THE PREFERRED EMBODIMENT

Figure 1:
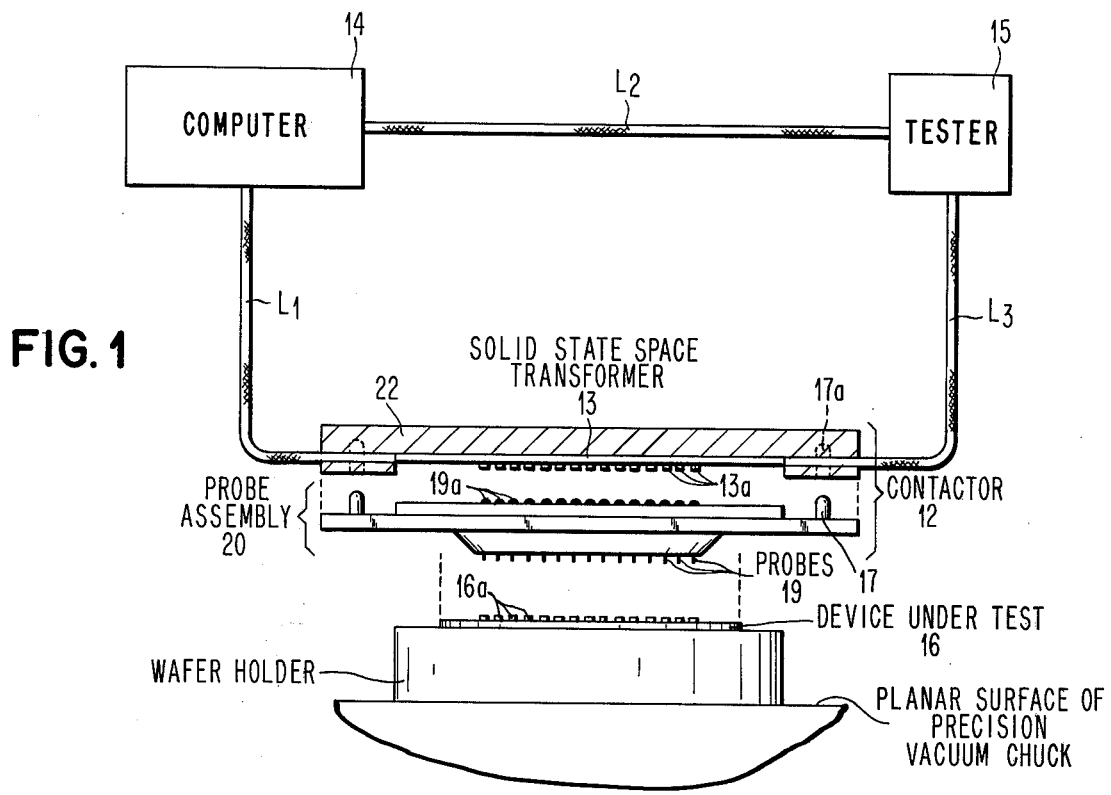
FIG. 1 schematically discloses a high speed electronic test system in accordance with the invention for testing electronic devices, packaging substrates, integrated circuit devices, etc. The system includes the interconnection of a computer, a tester, and a device under test contacting structure. The device under test contacting structure is schematically depicted in cross-section and includes a solid-state space transformer and a probe assembly.

Reference is made to the drawing and, in particular, FIG. 1. The device under test contacting structure, namely contactor 12, shown partially unassembled in FIG. 1, comprises the solid state space transformer 13 and probe assembly 20. The probe assembly comprises a plurality of probes 19 arranged in an array or pattern corresponding to the pattern of test points or pads 16a on the device under test 16.

The solid state space transformer holder 22 may be constructed from aluminum with a recessed portion in which the space transformer is seated. An epoxy adhesive may be employed to maintain the space transformer securely in position within the recess. The probe assembly 20 is secured to the member 22 by any one of a number of mechanical means, or mechanisms, known to the art. For example, fastening of the probe assembly 20 to the member 22 may be accomplished by diametrically disposed machine screws, or a suitable mechanical spring latch means. Although no means is expressly shown in the drawing for securing the probe assembly 20 to the member 22, which forms a backing or rigidity structure for the solid state space transformer, it is to be appreciated that the fastening means must provide precise alignment of the probe assembly and solid state space transformer. One suitable alignment means is precision machined dowels 17 carried by the probe assembly and mating with machined openings 17a provided in the solid state space transformer housing or holder 22.

The conductive lands 13a carried by on the lower planar surface of the solid state space transformer are also arranged in an array, or pattern, corresponding to the array, or pattern, in which the probes 19 are arranged. Thus, when the contactor 12 is in an assembled state, the conductive lands 13a respectively make electrical contact with the spherical end portions 19a of the probes 19. Thus, at the mating of the probe assembly 20 and the solid state space transformer 13 a large multiplicity of densely arrayed electrical connections are made on an easily separable electrical interface.

The easily separable electrical interface between the probe assembly 20 and the solid state space transformer 13 comprises the electrical connection of each land 13a of the space transformer with one of the end portions 19a of the probe assembly 20 as shown in FIG. 1.

Figure 5:
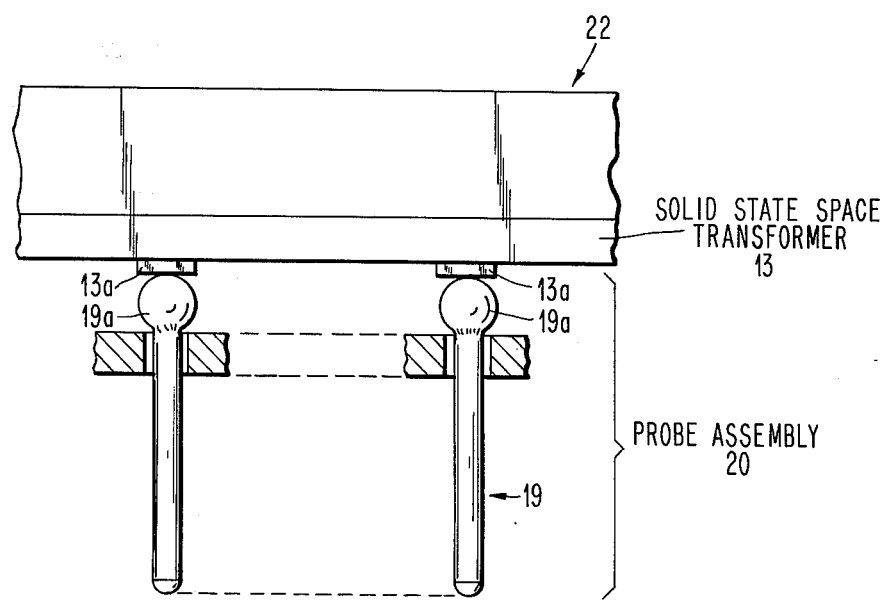
FIG. 5 is an enlarged cross-sectional view of a representative portion of the electrical interface between the solid state space transformer and the probe assembly of the invention.

In FIG. 5 an enlarged cross-sectional portion of the afore-identified electrical interface is shown. As is well known to persons skilled in the electronic testing art the connection between the lands 13a and the probe ends 19a must be a very low ohmic resistance connection having good wear characteristics.

As depicted in FIG. 1, the electronic test system includes a computer 14, tester 15 and contactor 12. The computer 14 communicates with the contactor 12 and and more specifically, the space transformer 13 via leads L1 and with tester 14 via leads L2. The tester 15 communicates with the contactor 12 and more specifically the space transformer 13 via leads L3, and with the computer system 14 via leads L2. It will be appreciated the term computer as here employed is generic to a computer system having input/output devices, a memory, data processing ability, etc.. The tester may be any one of a number of testers known to, and available to the art. For example, the computer system may be a dedicated mini-computer or a more sizeable time shared computer. Numerous suitable computers and computer systems are known to the art and commercially available.

As will be appreciated by persons skilled in the testing art, from the detailed description of the invention hereinafter, the device under test contacting structure may be employed in a test system consisting essentially of a computer system and suitable interface circuitry interconnecting the contactor structure with the computer system.

The practice of applicants' invention is not limited to the architecture of any particular electronic test system for testing electronic devices. An electronic test system generally of the type disclosed in pending U.S. patent application, now U.S. Pat. No. 3,916,306 Ser. No. 394,712, filed Sept. 6, 1973, by Michael J. Patti, entitled "Method and Apparatus for Testing High Circuit Density Devices" and of common assignee herewith, or generally of the type disclosed in pending U.S. patent application now U.S. Pat. No. 3,873,818 Ser. No. 410,592, filed Oct. 29, 1973, by John D. Barnard, entitled "Electronic Tester for Testing Devices having High Circuit Density", of common assignee herewith, may be employed to practice applicants' invention.

Referring to U.S. Pat. No. 3,806,800, of common assignee herewith, the electronic test system may be generally of the type disclosed therein. Namely, one suitable example of the tester 15 is of the type sold by Fairchild Systems Technology, Inc., Sunnyvale, Calif. as model No. 5000. One suitable example of the computer 14 is an IBM 1800 computer.

In summary, the tester supplies a sequence of test patterns to the space transformer. The computer allows automatic programmable selection of test lines to be achieved to encompass various product families and part numbers. The computer also provides data acquisition, tabulation, processing etc.

The solid-state space transformer 13 is preferably a silicon wafer containing a plurality of interconnected integrated circuits. The solid-state space transformer has contacts thereon for the connection of leads L1 and L2 and an array of conductive lands 13a for electrically interfacing with probes 19. The solid-state space transformer is fabricated by state of the art large scale integration technique known to persons skilled in the art. No detailed discussion of a process for fabricating the solid-state transformer is deemed necessary under the provisions of 35 U. S. C. 112.

An understanding of the fabrication process for constructing the solid-state-space transformer is not necessary to a full understanding of, and the ability to practice the invention disclosed and claimed herein.

Figure 4:
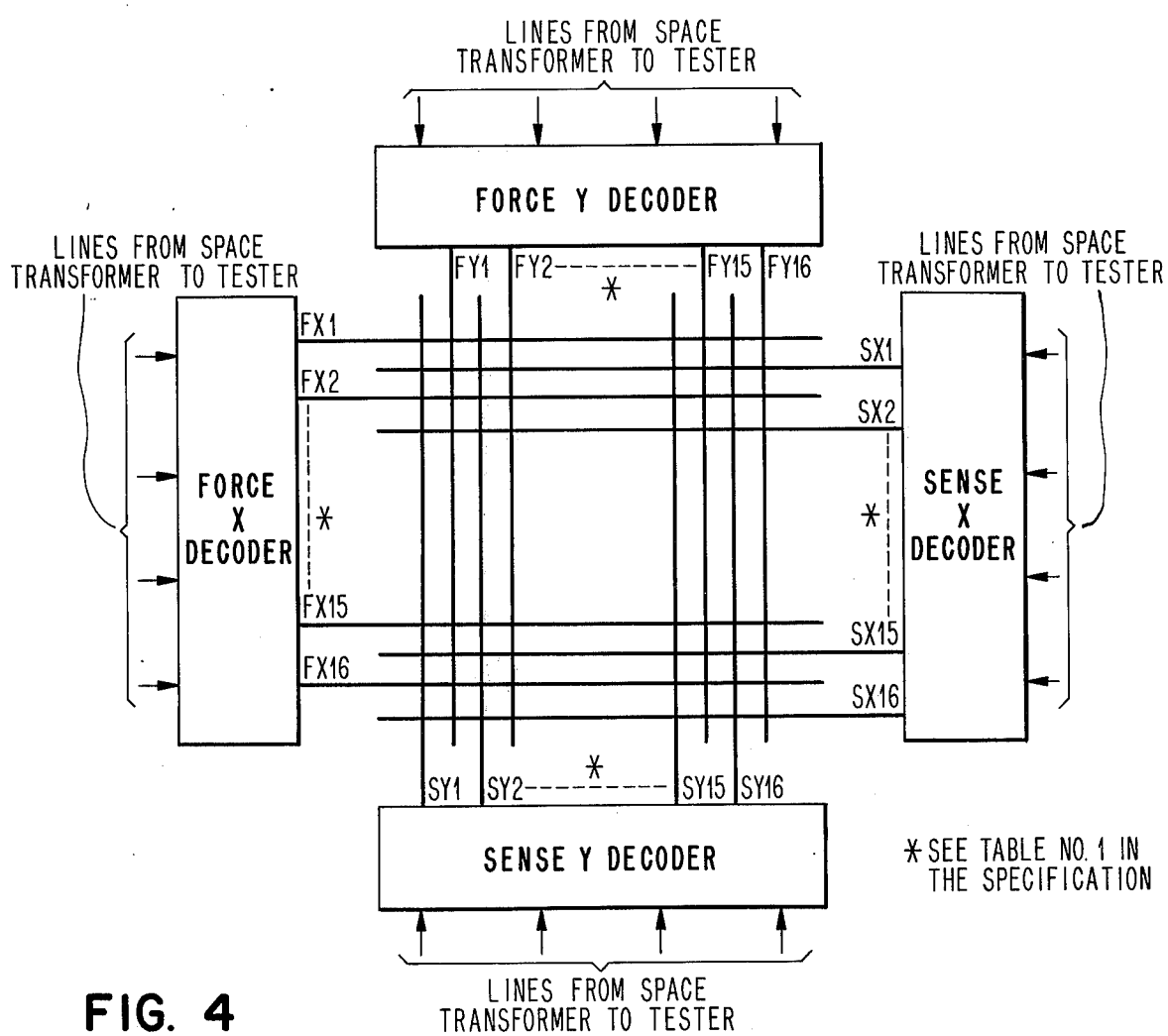
FIG. 4 schematically depicts additional logic circuitry, fabricated by large scale integration techniques within the solid state space transformer portion of the invention. The additional logic circuitry is employed to select and energize, under control of the test system, an array of circuitry of the type depicted in FIGS. 2 and 3.

The circuitry fabricated on and within the solid-state-space transformer will now be described in detail. Referring to FIG. 4, the solid-state transformer contains a total of four decoders. Namely, they are as labelled for convenience of explanation in FIG. 4, "Force X Decoder", "Force Y Decoder", "Sense X Decoder", and "Sense Y Decoder". Each decoder may be a binary decoder adapted to receive m inputs and select one out of $2^m$ outputs. Two of the decoders, namely the Force X decoder, and the Force Y Decoder provide a first matrix, herein after for convenience of explanation referred to as the "Force Matrix". The remaining two of the four decoders, namely, the Sense X Decoder and Sense Y Decoder provide a second matrix, hereinafter for convenience of explanation referred to as the "Sense Matrix". The Sense Matrix and Force Matrix are equal in logical dimension. Also, the selected output of the Force X Decoder is a logical "UP" condition: the selected output of the Force Y Decoder is a logical UP condition; the selected output of the Sense X Decoder is a logical "DOWN" condition; and the selected output of the Sense Y Decoder is a logical DOWN condition. Thus, it will be apparent the "Force" and "Sense" decoder operations are logically complementary.

In FIG. 4, each of the four decoders has four inputs and each provides a selection of one output of 16 possible outputs. $M = 4$ inputs, providing the ability to select one out of 16 outputs is an arbitrary selection, chosen for convenience of explanation. It will be appreciated the invention may be practiced with $m$ less than, or greater than 4.

Still referring to FIG. 4, the outputs of the decoders are preferably discrete metallized lines. The output lines FX1 through FX16 of the Force X Decoder and the output lines SX1 through SX16 of the Sense X Decoder may preferably be fabricated on a first level of metallization. The output lines FY1 through FY16 of the Force Y Decoder and the output lines SY1 through SY16 of the Sense Y decoder may preferably be fabricated on a second level of metallization.

Figure 2:
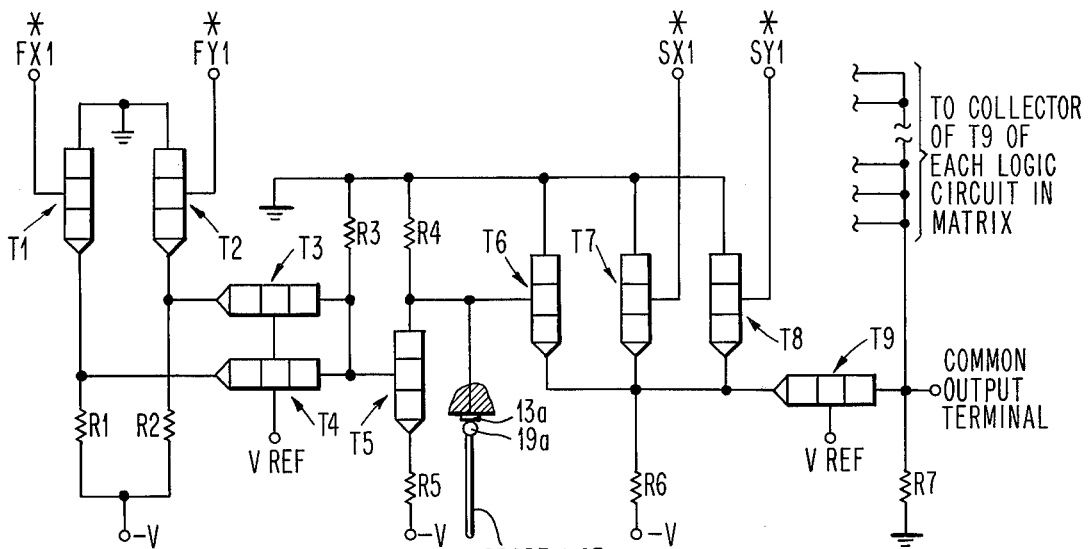
FIG. 2 discloses a representative logical circuit (one of a plurality) fabricated by large scale integration techniques within a silicon wafer space transformer of the invention.

The circuitry fabricated on and within the solid-state space transformer includes a plurality of logic circuits. A typical one of which is shown in FIG. 2. As will be fully apparent from the description that follows, each logic circuit functions under control of the Sense Matrix, and the Force Matrix. Each logic circuit is electrically connected to a discrete probe 19 of the probe assembly 20.

In the preferred embodiment each of the plurality of logic circuits is represented by the logic circuit shown in FIG. 2. The logic circuit shown in FIG. 2 may be considered as one of a matrix of logic circuits, where each logic circuit is interconnected between the Force Matrix, the Sense Matrix and a probe 19. The representative logical circuit in FIG. 2 is shown connected to, the output FX1 of the Force X Decoder, the output FY1 of the Force Y Decoder, the output SX1 of the Sense X Decoder, the output SY1 of the Sense Y Decoder, and via the electrical interface (13a and 19a, see FIG. 1) to a discrete probe 19 of the assembly. The connection of the logical circuit of FIG. 2 is representative of the connection of each of the plurality of logic circuits. Thus, the plurality of logic circuits may be considered to a matrix of logic circuits selectively connected to the Force Matrix, the Sense Matrix and the probe assembly 20. In summary, each logic circuit of the matrix of logic circuits is represented by the circuit of FIG. 2. Each logic circuit of the matrix of logic circuits has, the base of its transistor T1 connected to an output of the Force X Decoder, the base of its transistor T2 connected to an output of the Force Y Decoder, the base of its transistor T7 connected to an output of the Sense X Decoder, the base of its transistor T8 connected to an output of the Sense Y Decoder, and the collector of transistor T5, together with the base of transistor T6 connected to a discrete probe 19 of the probe assembly 20. Further as shown schematically in FIG. 2, the collector of transistor T9 of each of the logic circuits is commonly connected through resistor R7 to a reference potential (ground) and to a common output terminal.

Thus, it will be apparent that the preferred embodiment of the invention as illustrated in the drawings may have 256 probes each discretely controlled by a single logic circuit within the matrix of logic circuits. The logical operation of the circuit of FIG. 2 will be fully apparent from a detailed explanation hereinafter of how any two selected circuits of the logical circuit matrix are employed to determine the electrical integrity of a conductive path between two pads on a device under test.

In the following table, Table No. 1, the interconnection of a (16 × 16) Force Matrix, a (16 × 16) Sense Matrix a (256) logical circuit Matrix and a probe assembly having 256 probes is tabulated. The content of Table No. 1, namely the particular numbering, and particular interconnections are not to be taken as a limitation of the invention. The content of Table No. 1 is illustrative, representative and a convenience in explanation.

TABLE NO. 1

| Logical Circuit Number of Logical Circuits in Matrix | Probe Number In Probe Assembly | Force Matrix Connections to Logical Circuit | Sense Matrix Connections to Logical Circuit |
|---|---|---|---|
| 1 | 1 | FX1, FY1 | SY1, SX1 |
| 2 | 2 | FX2, FY1 | SY1, SX2 |
| 3 | 3 | FX3, FY1 | SY1, SX3 |
| 4 | 4 | FX4, FY1 | SY1, SX4 |
| . | . | .. | .. |
| . | . | .. | .. |
| . | . | .. | .. |
| 14 | 14 | FX14,FY1 | SY1, SX14 |
| 15 | 15 | FX15,FY1 | SY1, SX15 |
| 16 | 16 | FX16,FY1 | SY1, SX16 |
| 17 | 17 | FX1, FY2 | SY2, SX1 |
| 18 | 18 | FX2, FY2 | SY2, SX2 |

TABLE NO. 1-continued

| Logical Circuit Number of Logical Circuits in Matrix | Probe Number In Probe Assembly | Force Matrix Connections to Logical Circuit | Sense Matrix Connections to Logical Circuit |
|---|---|---|---|
| . | . | . . | . . |
| . | . | . . | . . |
| . | . | . . | . . |
| 31 | 31 | FX15,FY2 | SY2, SX15 |
| 32 | 32 | FX16,FY2 | SY2, SX16 |
| 33 | 33 | FX 1,FY3 | SY3, SX1 |
| 34 | 34 | FX 2,FY3 | SY3, SX2 |
| . | . | . . | . . |
| . | . | . . | . . |
| . | . | . . | . . |
| 47 | 47 | FX15,FY3 | SY3, SX15 |
| 48 | 48 | FX16,FY3 | SY3, SX16 |
| 49 | 49 | FX1, FY4 | SY4, SX1 |
| 50 | 50 | FX2, FY4 | SY4, SX2 |
| . | . | . . | . . |
| . | . | . . | . . |
| . | . | . . | . . |
| 63 | 63 | FX15,FY4 | SY4, SX15 |
| 64 | 64 | FX16,FY4 | SY4, SX16 |
| 65 | 65 | FX1, FY5 | SY5, SX1 |
| 66 | 66 | FX2, FY5 | SY5, SX2 |
| . | . | . . | . . |
| . | . | . . | . . |
| . | . | . . | . . |
| 254 | 254 | FX14,FY16 | SY16,SX14 |
| 255 | 255 | FX15,FY16 | SY16,SX15 |
| 256 | 256 | FX16,FY16 | SY16,SX16 |

Each logical circuit of the matrix of logical circuits may be selected to function or perform as a Force circuit, or as a Sense circuit. A logical circuit selected to perform as a Force circuit has each of its Force inputs, FX and FY, in a logical UP condition, and one, or both, of its Sense inputs, SX and SY, in an UP condition. Correspondingly, when a logical circuit is selected to perform as a Sense Circuit, it has each of its Sense inputs, SX and SY in, a DOWN condition and one, or both, of its Force inputs, FX and FY in a DOWN condition. Thus, for example, referring to Table No. 1, it will be seen that logical circuit Number 17 is selected to perform a Force function when Force Inputs FX1 and FY2 are respectively in an UP condition, and one, or both, of the Sense inputs SY2 and SX1 are in an UP condition. Correspondingly, still referring to Table No. 1, logical circuit Number 33 is selected to perform a Sense function when Sense Inputs SY3 and SX1, are respectively in a DOWN condition, and one, or both, of the Force inputs FX1 and FY3 are in a DOWN condition. It will now be apparent from the preceding description that any one of the 256 logical circuits comprising the monolithic logical circuit matrix may be selected by the Force Matrix to perform a "Force Function". Also, any one of the 256 logical circuits comprising the monolithic logical circuit matrix may be selected by the Sense Matrix to perform a Sense Function. As will be apparent from the further description set-forth hereinafter, except for testing the logical circuit, the same logical circuit of the logical circuit matrix is not concurrently selected by the Force Matrix and the Sense Matrix.

In the further description of the operation of the invention set forth below, it will be apparent that the logical circuit performing the "Force Operation" and the logical circuit performing the "Sense Operation" are customarily discrete different ones of the plurality of logical circuits comprising the monolithic logical circuit matrix.

It is to be appreciated that with each of the 256 logical circuits, a discrete probe 19 of probe assembly 20 is associated and interconnected therewith. Thus, it is apparent any one of the probes 19 may be addressed to perform a Force function and any one, other than a probe addressed to perform a Force function may be addressed to perform a Sense function.

Figure 3:
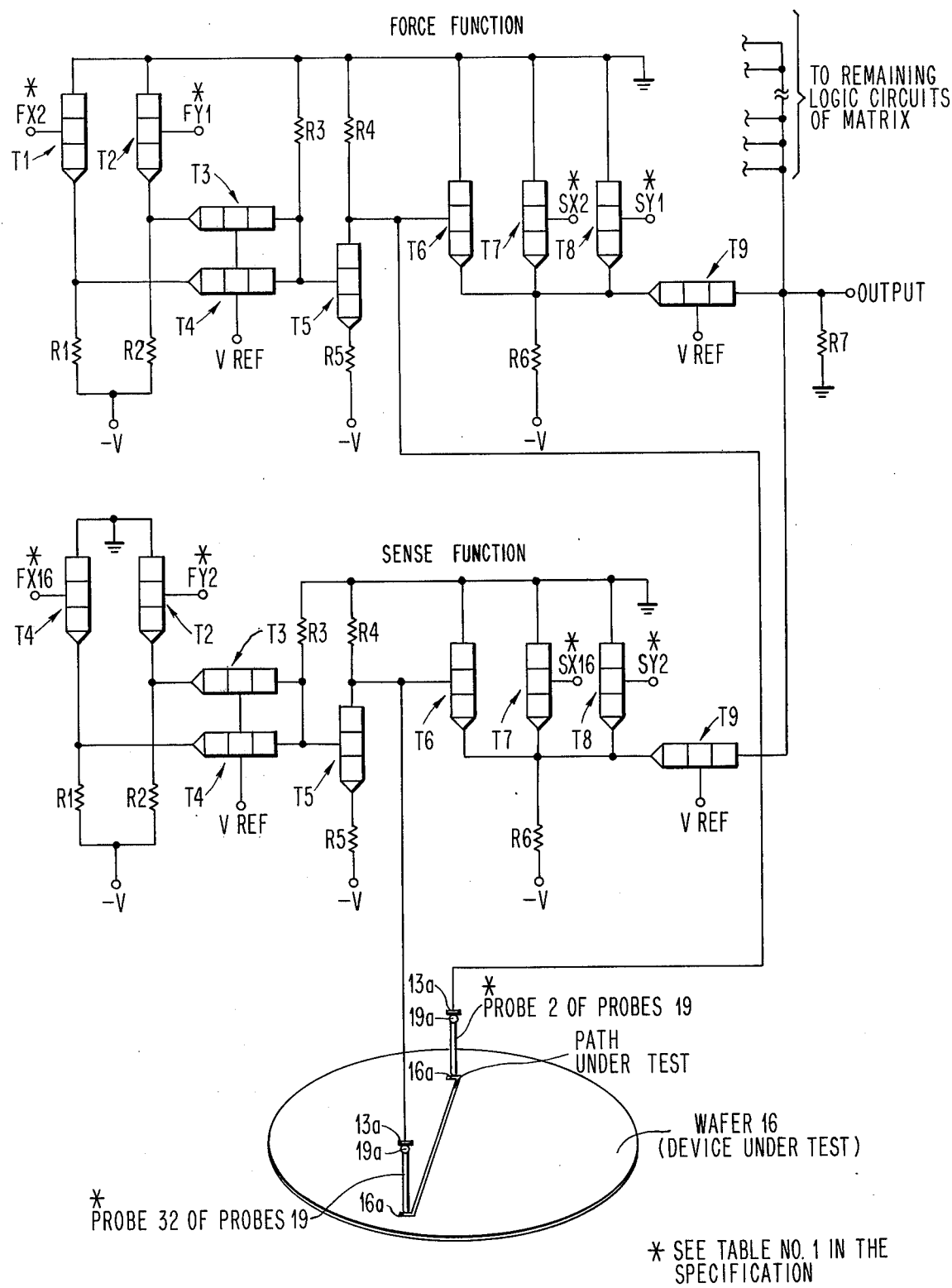
FIG. 3 discloses two representative logical circuits of the plurality, or matrix thereof, fabricated by large scale integration techniques within the solid state space transformer portion of the invention. The two representative logical circuits are depicted with their respective probes contacting test points on a structure undergoing test.

With reference to FIG. 3, the practice of the invention, in a representative application thereof, will be explained in detail. In FIG. 3, it will be seen that two logical circuits of the type shown in FIG. 2 are shown. The upper logical circuit in this illustrative example is performing the Force operation, as depicted by the legend Force Function. In the upper circuit, the Force inputs FX2 and FY1 thereof are respectively in an UP condition and at least one of the Sense inputs, SX2 and SY1, is in an UP condition. With the UP potential level on FX2 and FY1, transistors T1 and T2 are respectively conductive, T3 and T4 are rendered non-conductive and T5 conductive. The potential at the collector of conductive transistor T5 is DOWN. This DOWN potential is impressed via probe No. 2 (See Table No. 1) of the plurality of probes 19 on a land 16a of the device under test, or water 16, as shown in FIG. 3.

The lower logical circuit in this illustrative example (FIG. 3) has been selected to perform the Sense Operation, as depicted by the legend Sense Function. In the lower circuit as viewed in FIG. 3, Sense Inputs, SX16 and SY2, thereof are respectively in a DOWN condition and at least one of the Force inputs, FX16 and FY2, is in a DOWN condition. Transistor T5 of the logical circuit selected to perform the sense function, namely the lower circuit as viewed in FIG. 3 is non-conductive since at least one of the inputs FX16 and FY2 is DOWN.

It will now be apparent from viewing FIG. 3 and the immediately preceding discussion that the following conditions may exist. (1) If the conductive path under test as shown in FIG. 3 is open (or very high resistance) the base of transistor T6 in the Sense circuit will be in an UP condition. The "common output Terminal", connected in common to the collectors of transistors T9 and via resistor R7 to ground, will be in an UP condition. (2) If the conductive path under test as shown in FIG. 3 is closed (or very low resistance) the base of transistor T6 in the Sense circuit will be at a DOWN condition. (Same potential as collector of conductive transistor T5 of the Force circuit). The "Common Output Terminal" will be DOWN.

In summary, when the upper logic circuit as viewed in FIG. 3 is selected as a "Force Circuit" and the lower circuit as a "Sense Circuit" the Common Output Terminal will be DOWN if the circuit path under test is closed, and UP if the circuit path under test is open. It will be appreciated that in the illustrative example of operation as depicted in FIG. 3 the lower circuit could have been selected as the Force circuit and the upper circuit as the Sense circuit.

Summary of the Solid-State Space Transformer of the Preferred Embodiment

There are total of four decoders, two identified as Force and two identified as Sense. Each is a binary decoder with a number of inputs ($m$) that provide a greater number of outputs ($2^m$). The decoders are arranged to provide two matrices, a Force and a sense. The "X" and "Y" dimensions of the Force matrix are equal to the corresponding X and Y dimensions of the Sense matrix. Metallized lines from each output of the decoders run to a matrix of monolithic circuits. The Force and Sense decoder operations are logically reversed, that is, the selected output of each Force decoder is UP while the selected output of each Sense decoder is DOWN.

Corresponding to the common dimensions of the Force and Sense matrices is a matrix of monolithic circuits. These circuits perform the desired Force or Sense operation determined by the decoders. Since only one output of each Force decoder can be at an UP level, only one monolithic circuit in the matrix can be selected to perform a Force function at any given time. Likewise, since only one output of each Sense decoder can be at a Down level, only one monolithic circuit in the matrix can be selected to perform a Sense function at any given time.

A monolithic circuit is selected to perform a Force function when both Force Inputs thereof namely "FX" and "FY" are UP. It is selected to perform a "Sense" function when both Sense Inputs thereof "SX" and "SY" are DOWN. The outputs of the monolithic circuits are dotted together through metallized lands and connected to a resistor. The output at the resistor is DOWN, if, and only if, a short exists between the monolithic circuit selected as Force and the monolithic circuit selected as Sense. The output at the resistor is UP if, and only if, an open exists between the monolithic circuit selected as Force and the monolithic circuit selected as Sense.

It is to be appreciated that the practice of the invention may vary in form and structure without departing from the spirit of the invention.

For example, the solid state transformer may with appropriated designed circuitry fabricated therein provide inputs, and accept outputs from integrated circuit devices, such as a logical devices, under test.

The solid state space transformer may with appropriately designed circuitry fabricated therein be employed advantageously in the testing of integrated circuit devices fabricated by large scale integration techniques and containing combinatorial and sequential logic.

The solid state space transformer has the capability to electronically switch the testing to any two points on a closely spaced grid pattern.

The solid state space transformer may be employed with an array of probes utilized to contact test pads on a device under test where the pads on the device under test are spaced one from another on a 0.25 millimeter grid or less.

The solid state space transformer may be employed to test the interconnection between chip islands on an undiced wafer.

The solid state space transformer may be employed to test the interconnections within a Multi-Layer Ceramic structure.

It is to be appreciated that test systems (AC and DC) may be designed where the solid state, preferably silicon, space transformer is fabricated to contain monolithic circuits for providing pulses of proper rise time, shape and level for application to a device under test.

While the invention has been described and shown particularly with reference to one of its preferred embodiments, it will be understood by those skilled in the art to which the work is directed that various changes in form and detail may be made without departing from either the spirit or scope of the invention.

What is claimed is:

1. A space transformer for use in an electronic test system for testing micro-miniature electronic devices, said space transformer comprising:
   a monolithic silicon structure;
   said silicon structure containing, a first binary decoder circuit adapted to receive a first set of $m$ binary inputs and provide a first set of $2^m$ binary outputs, a second binary decoder circuit adapted to receive a second set of $m$ binary inputs and provide a second set of $2^m$ binary outputs, a third binary decoder circuit adapted to receive a third set of $m$ binary inputs and provide a third set of $2^m$ binary outputs, a fourth binary decoder circuit adapted to receive a fourth set of $m$ binary inputs and provide a fourth set of $2^m$ binary outputs, where $m$ may be any integer number, a plurality of logic circuits selectively connected to said outputs of said first, second, third and fourth binary decoders, an array of exposed conductive pads connected to said plurality of logic circuits.

2. A space transformer for use in an electronic test system for testing micro-miniature electronic devices as recited in claim 1 further characterized in that said plurality of logic circuits is equal in number to $m^2$.

3. A space transformer for use in an electronic test system for testing micro-miniature electronic devices as recited in claim 2 further characterized in that each of said $m^2$ logic circuits is connected to a discrete output of each of said first, second third and fourth binary decoders, whereby each of said $m^2$ logic circuits is uniquely connected to said first, second, third and fourth binary decoders, whereby said first, second, third and fourth sets of $m$ binary inputs may be employed to select and condition a predetermined first and second ones of said $m^2$ logic circuits.

4. A space transformer for use in an electronic test system for testing micro-miniature electronic devices as recited in claim 3 wherein each of said $m^2$ logic circuits is essentially identical to each other one of said $m^2$ logic circuits and said predetermined first one of said $m^2$ logic circuits is adapted to perform a first function and said predetermined second one of said $m^2$ logic circuits is adapted to perform a second function.

5. In an electronic test system for electrically testing very small electronic structures, a contactor structure for making electrical contact with an electrical structure undergoing test, said contactor comprising:
   a space transformer as recited in claim 4;
   a probe assembly electrically and mechanically mated with said contactor structure, said probe assembly having a plurality of probes each of said probes being in electrical contact with one of said array of exposed conductive pads of said space transformer.

* * * * *